United States Patent
Iwane

(10) Patent No.: US 9,838,618 B2
(45) Date of Patent: Dec. 5, 2017

(54) IMAGE PROCESSING DEVICE CONFIGURED TO CORRECT OUTPUT DATA BASED UPON A POINT SPREAD FUNCTION

(71) Applicant: NIKON CORPORATION, Tokyo (JP)

(72) Inventor: Toru Iwane, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 115 days.

(21) Appl. No.: 14/413,288

(22) PCT Filed: Jul. 12, 2013

(86) PCT No.: PCT/JP2013/069193
§ 371 (c)(1),
(2) Date: May 6, 2015

(87) PCT Pub. No.: WO2014/010734
PCT Pub. Date: Jan. 16, 2014

(65) Prior Publication Data
US 2015/0319351 A1    Nov. 5, 2015

(30) Foreign Application Priority Data
Jul. 12, 2012   (JP) ................................ 2012-156940

(51) Int. Cl.
*H04N 5/232* (2006.01)
*H04N 5/272* (2006.01)
(Continued)

(52) U.S. Cl.
CPC ....... *H04N 5/272* (2013.01); *H01L 27/14627* (2013.01); *H04N 5/2254* (2013.01); *H04N 5/232* (2013.01)

(58) Field of Classification Search
CPC ... H01L 27/14627; H04N 5/232; H04N 5/272
See application file for complete search history.

(56) References Cited

U.S. PATENT DOCUMENTS

2004/0085475 A1*   5/2004   Skow ..................... H04N 5/235
348/362
2008/0068466 A1    3/2008   Tamaru et al.
(Continued)

FOREIGN PATENT DOCUMENTS

| CN | 101150660 A | 3/2008 |
|---|---|---|
| JP | 2007-004471 A | 1/2007 |

(Continued)

OTHER PUBLICATIONS

NG, "Fourier Slice Photography," Stanford University.
(Continued)

*Primary Examiner* — Amy Hsu
(74) *Attorney, Agent, or Firm* — Oliff PLC

(57) ABSTRACT

An image-capturing device includes: a plurality of microlenses arranged in a two-dimensional manner; a plurality of photodetectors arranged to correspond to the plurality of microlenses; an image synthesizing part that synthesizes an image at an optional image plane of a photographic optical system, based on signals from the plurality of photodetectors; and an image processing part that removes signals of other pixels from signals of pixels constituting the image synthesized in the image synthesizing part.

5 Claims, 14 Drawing Sheets

(51) Int. Cl.
H01L 27/146 (2006.01)
H04N 5/225 (2006.01)

(56) References Cited

U.S. PATENT DOCUMENTS

| | | | | |
|---|---|---|---|---|
| 2008/0187305 A1* | 8/2008 | Raskar | ............... | G02B 27/0075 396/268 |
| 2009/0140131 A1* | 6/2009 | Utagawa | .............. | G02B 3/0056 250/226 |
| 2010/0003024 A1* | 1/2010 | Agrawal | ............ | H04N 5/23229 396/340 |
| 2012/0327267 A1* | 12/2012 | Takahara | .................. | G02B 7/34 348/231.99 |
| 2013/0222676 A1* | 8/2013 | Ono | .......................... | G02B 3/14 348/345 |
| 2014/0176592 A1* | 6/2014 | Wilburn | ............. | H04N 5/23212 345/589 |

FOREIGN PATENT DOCUMENTS

| | | |
|---|---|---|
| JP | 2010-258689 A | 11/2010 |
| WO | 2012/043211 A1 | 4/2012 |

OTHER PUBLICATIONS

Aug. 6, 2013 International Search Report issued in International Application No. PCT/JP2013/069193.
Apr. 26, 2017 Office Action issued in Chinese Patent Application No. 201380036923.6.
Sep. 19, 2017 Office Action issued in Japanese Application No. 2014-524899.

* cited by examiner (a)

(b)

(a)

(b)

(a)

(b)

| 0 | 0 | 0 | 0 | 0 | 0 | 0 | 0 | 0 |
|---|---|---|---|---|---|---|---|---|
| 0 | 0.0625 | 0.125 | 0.1875 | 0.25 | 0.1875 | 0.125 | 0.0625 | 0 |
| 0 | 0.125 | 0.25 | 0.375 | 0.5 | 0.375 | 0.25 | 0.125 | 0 |
| 0 | 0.1875 | 0.375 | 0.5625 | 0.75 | 0.5625 | 0.375 | 0.1875 | 0 |
| 0 | 0.25 | 0.5 | 0.75 | 1 | 0.75 | 0.5 | 0.25 | 0 |
| 0 | 0.1875 | 0.375 | 0.5625 | 0.75 | 0.5625 | 0.375 | 0.1875 | 0 |
| 0 | 0.125 | 0.25 | 0.375 | 0.5 | 0.375 | 0.25 | 0.125 | 0 |
| 0 | 0.0625 | 0.125 | 0.1875 | 0.25 | 0.1875 | 0.125 | 0.0625 | 0 |
| 0 | 0 | 0 | 0 | 0 | 0 | 0 | 0 | 0 |

(a)

(b)

IMAGE PROCESSING DEVICE CONFIGURED TO CORRECT OUTPUT DATA BASED UPON A POINT SPREAD FUNCTION

TECHNICAL FIELD

The present invention relates to an image-capturing device.

BACKGROUND ART

Conventionally, an image-capturing device synthesizing an image focused on an optional image plane from data captured in one photographic shot has been known. For example, an image-capturing device described in patent literature 1 synthesizes image data based on output values of pixels receiving rays passing through a photographic optical system and being incident on the centers of a plurality of microlenses.

CITATION LIST

Patent Literature

PATENT LITERATURE 1: Japanese Laid-Open Patent Publication No. 2007-4471

SUMMARY OF INVENTION

Technical Problem

In the prior art, there is a problem of decreasing a contrast of synthetic image data, when a width of a virtual pixel is set narrower than a pitch of a microlens in order to increase a resolution of the synthetic image data.

Solution to Problem

According to the 1st aspect of the present invention, an image-capturing device comprises: a plurality of microlenses arranged in a two-dimensional manner; a plurality of photodetectors arranged to correspond to the plurality of microlenses; an image synthesizing part that synthesizes an image at an optional image plane of a photographic optical system, based on signals from the plurality of photodetectors; and an image processing part that removes signals of other pixels from signals of pixels constituting the image synthesized in the image synthesizing part.

According to the 2nd aspect of the present invention, in the image-capturing device according to the 1st aspect, it is preferred that: signals from a plurality of photodetectors corresponding to the pixel and signals from a plurality of photodetectors corresponding to the other pixels include signals from overlapping photodetectors; and the image processing part removes signals of the overlapping other pixels from the signals from the plurality of photodetectors corresponding to the pixel.

According to the 3rd aspect of the present invention, an image-capturing device comprises: a plurality of microlenses arranged in a two-dimensional manner so that a light flux passing through a photographic optical system is incident thereon; a plurality of photodetectors arranged behind the plurality of microlenses to correspond to each of the plurality of microlenses; an image synthesizing part that synthesizes image data of an image at an optional image plane of the photographic optical system, based on outputs of the plurality of photodetectors corresponding to each of the plurality of microlenses; a Fourier transforming part that performs a Fourier transform on the image data synthesized in the image synthesizing part; an operating unit that effectively divides a result of the Fourier transform in the Fourier transforming part, by a Fourier image of a point spread function representing an optical divergence of the light flux incident on the plurality of microlenses; and an inverse Fourier transforming part that performs an inverse Fourier transform on a result of the division in the operating unit to create target image data.

According to the 4th aspect of the present invention, in the image-capturing device according to the 3rd aspect, it is preferred that the operating unit effectively divides the result of the Fourier transform in the Fourier transforming part, by applying a Wiener filter based on the Fourier image of the point spread function to the result of the Fourier transform in the Fourier transforming part.

According to the 5th aspect of the present invention, in the image-capturing device according to the 3rd or 4th aspect, it is preferred that a size of the point spread function is equal to a size of a region covered by one microlense.

According to the 6th aspect of the present invention, in the image-capturing device according to the 5th aspect, it is preferred that the number of elements of the point spread function is equal to the number of the plurality of photodetectors covered by one microlens.

According to the 7th aspect of the present invention, in the image-capturing device according to any one of the 3rd through 6th aspects, it is preferred that the point spread function is determined from an arrangement of the plurality of microlenses and an arrangement of pixels synthesized in the image synthesizing part.

Advantageous Effect of Invention

According to the present invention, it is possible to synthesize image data having both a high contrast and a high resolution.

DESCRIPTION OF EMBODIMENTS (First Embodiment)

A digital camera according to this embodiment creates image data having a focal position desired by the user, with numerical processing, by utilizing the fact that an image signal acquired by photography through a microlens array has wavefront information such as depth information. A light flux (bundle of rays) from a subject, which is incident through a photographic lens, converges in the vicinity of the microlens array. In this regard, a position at which the light flux converges varies in an optical axis direction of the photographic lens, depending on the position of the subject. Furthermore, light fluxes from the subject do not converge on one and the same plane if the subject is a three-dimensional object. The digital camera according to this embodiment creates (synthesizes) image data that reproduces a subject image formed at an imaging position in the optical axis direction desired by the user. The created image data will be hereinafter referred to as synthetic image data. The synthetic image data appears as if a focal point of an imaging optical system were at this imaging position (not a real imaging position, but the position desired by the user). Thus, in the following description, this imaging position will be referred to as a focal position.

Furthermore, the digital camera according to this embodiment is configured to be able to create synthetic image data having a resolution that is larger than the number of microlenses included in the microlens array. The digital camera includes a large number of microlenses and a plurality of image-capturing pixels (photodetectors (light receiving elements)) corresponding to each individual microlens. In order to create synthetic image data having a focal position selected by the user, the digital camera uses not only image signals output from image-capturing pixels corresponding to one microlens, but also image signals output from image-capturing pixels corresponding to microlenses arranged around said microlens to create a synthetic image signal which corresponds to an imaging region for one pixel of the synthetic image data, thereby creating synthetic image data having a variable focal position. This will be described in detail hereinafter.

Figure 1:
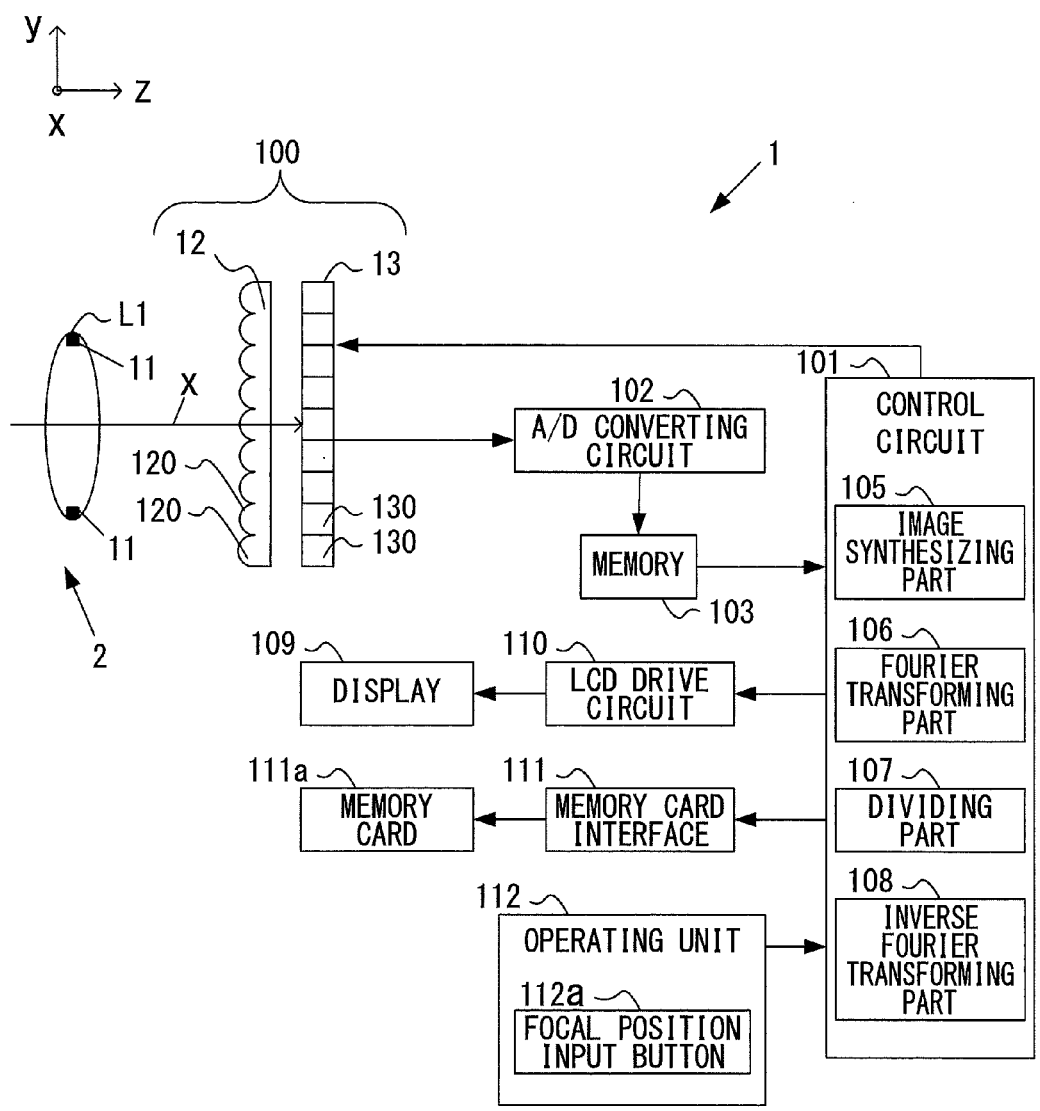
FIG. 1 A view showing a configuration of a digital camera according to a first embodiment.

FIG. 1 is a view showing a configuration of the digital camera according to the first embodiment. The digital camera 1 is configured such that an interchangeable lens 2 having a photographic lens L1 is removably attached thereto with a bayonet-type lens mount mechanism, for example. The digital camera 1 includes an image-capturing unit 100, a control circuit 101, an A/D conversion circuit 102, a memory 103, an operating unit 112, a display device 109, a LCD drive circuit 110, and a memory card interface 111. The image-capturing unit 100 includes a microlens array 12 having a large number of microlenses 120 arranged in a two-dimensional manner, and an image sensor 13. It should be noted that in the following description, the Z-axis is set to be parallel to an optical axis of the photographic lens L1, while the X-axis and the Y-axis are set to be orthogonal to each other in a plane orthogonal to the Z-axis.

The photographic lens L1 is composed of a plurality of groups of optical lenses and converges a light flux from a subject in the vicinity of a focal plane of the photographic lens L1. The photographic lens L1 is provided with an aperture 11 for adjusting an incident light amount. For the purpose of explanation, the photographic lens L1 is represented by one representative lens in FIG. 1. In the vicinity of a predetermined imaging plane of the photographic lens L1, the microlens array 12 and the image sensor 13 are sequentially arranged. The image sensor 13 is composed of a CCD or a CMOS image sensor having a plurality of photoelectric conversion elements. The image sensor 13 captures a subject image formed on the image-capturing plane and outputs a photoelectric conversion signal (an image signal), which is dependent on the subject image, to the A/D conversion circuit 102 under the control of the control circuit 101. The image-capturing unit 100 will be described in detail hereinafter.

The A/D conversion circuit 102 is a circuit processing the image signal output from the image sensor 13 in an analogous manner and then converting the image signal to a digital image signal. The control circuit 101 is composed of a CPU and peripheral circuits such as a memory or the like. The control circuit 101 reads and executes a control program previously stored in a ROM (not shown) or the like. This control program causes the control circuit 101 to perform a predetermined calculation by using signals input from parts constituting the digital camera 1 and send out control signals to the parts of the digital camera 1, in order to control photographic operations. Moreover, the control circuit 101 determines a focal position of synthetic image data, based on an operating signal input from the operating unit 112 in response to operation of a focal position input button 112a, as described hereinafter.

The control circuit 101 functionally includes an image synthesizing part 105, a Fourier transforming part 106, a dividing part 107, and an inverse Fourier transforming part 108. The image synthesizing part 105 synthesizes synthetic image data at an optionally selected focal plane different from the predetermined focal plane of the photographic lens L1. The Fourier transforming part 106 performs a Fourier transform on the synthetic image data synthesized in the image synthesizing part 105. The dividing part 107 effectively divides the result of the Fourier transform by a Fourier image of a point spread function described hereinafter. The inverse Fourier transforming part 108 performs an inverse Fourier transform on the result of the division in the dividing part 107 to create target image data. The image synthesizing part 105, the Fourier transforming part 106, the dividing part 107, and the inverse Fourier transforming part 108 will be described in detail hereinafter.

The memory 103 is a volatile storage media used for temporarily storing the image signal that has been digitally converted by the A/D conversion circuit 102, or data during or after image processing, image compression processing, and display image data creation processing. The memory card interface 111 is an interface to which a memory card 111a is removably attached. The memory card interface 111 is an interface circuit for writing image data into the memory card 111a or reading image data recorded in the memory card 111a, under the control of the control circuit 101. The memory card 111a is a semiconductor memory card, such as a Compact Flash (registered trademark) or a SD card.

The LCD drive circuit 110 is a circuit for driving the display device 109 based on instructions of the control circuit 101. The display device 109 is composed of a liquid crystal panel or the like and displays display data created in the control circuit 101 based on the image data recorded in the memory card 111a, in a reproducing mode. A menu screen for setting various operations of the digital camera 1 is also displayed on the display device 109.

The operating unit 112 accepts operations from the user and outputs various operating signals, which are dependent on contents of the operations, to the control circuit 101. The operating unit 112 includes a focal position input button 112a, a power button, a release button, a display switching button for other setting menus, and a setting menu select button, for example. The focal position input button 112a is operated by the user to input a focal position y of the synthetic image data. Once the focal position y is selected by the operation of the focal position input button 112a by the user, the operating unit 112 outputs an operating signal including the focal position y to the control circuit 101.

A configuration of the image-capturing unit 100 will now be described in detail, with reference to a perspective view of the image-capturing unit 100 shown in FIG. 2. The image-capturing unit 100 has the microlens array 12 and the image sensor 13. The microlens array 12 has a plurality of microlenses 120 which are squarely arranged in a two-dimensional manner on the XY plane. In the image sensor 13, photoelectric conversion elements 130 (hereinafter referred to as image-capturing pixels 130) are arranged in a two-dimensional manner, in an arrangement pattern corresponding to the microlenses 120. The photoelectric conversion elements 130 receive light passing through each microlens 120. The image sensor 13 is arranged at a distance of a focal length f of the microlens 120, from the microlens array 12. In other words, for each microlens 120, a plurality of image-capturing pixels 13 corresponding to (or covered by) the microlens 120 are provided at a distance of the focal length f of the microlens 120.

Figure 2:
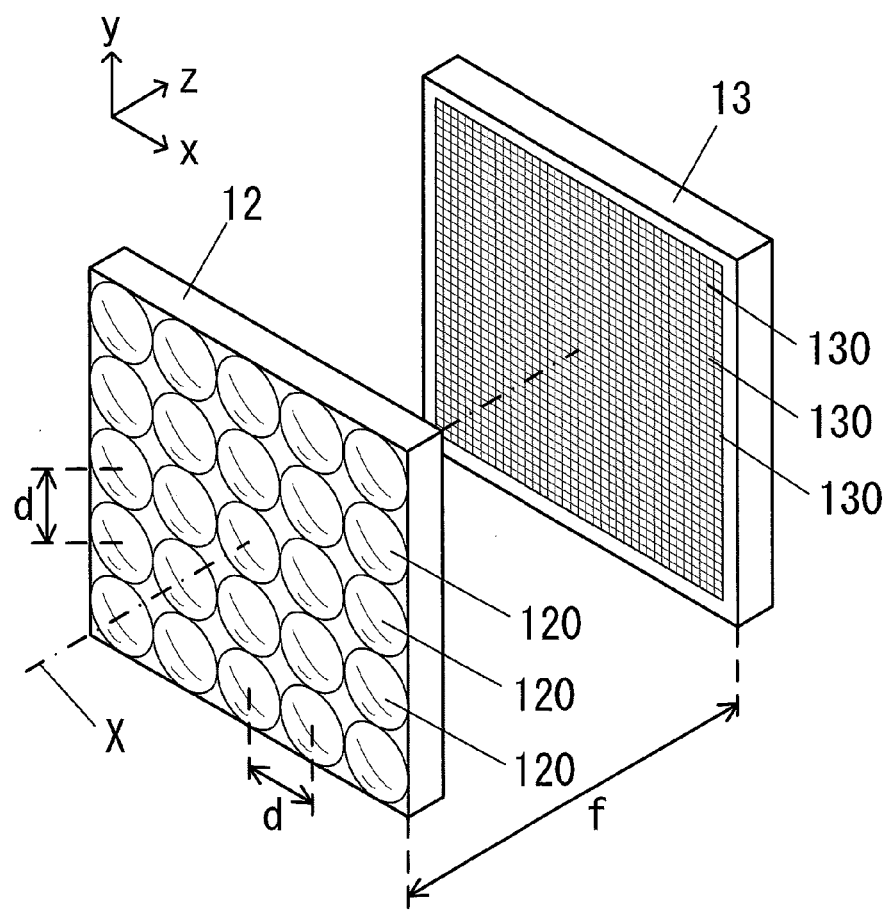
FIG. 2 A perspective view of an image-capturing unit 100.

It should be noted that only a part of the plurality of microlenses 120 provided in the microlens array 12 and the plurality of image-capturing pixels 130 provided in the image sensor 13 is shown in FIG. 2. In practice, there are more microlenses 120 and image-capturing pixels 130. For example, approximately 100 image-capturing pixels 130 are covered by one microlens 120 and the number of the microlenses 120 included in the microlens array 12 is thus approximately 1/100 of the number of the image-capturing pixels 130 included in the image sensor 13.

For example, given that the focal length of the photographic lens L1 is 50 millimeter, a position of a so-called exit pupil of the photographic lens L1 can be then considered to be virtually at infinity compared with the microlens 120, as seen from the image sensor 13, because the focal length f of the microlens 120 is approximately several hundreds micrometer (approximately 1/100 of the focal length of the photographic lens L1). Thus, the position of the exit pupil of the photographic lens L1 and the image-capturing plane of the image sensor 13 can be considered to be optically conjugate to each other.

Figure 3:
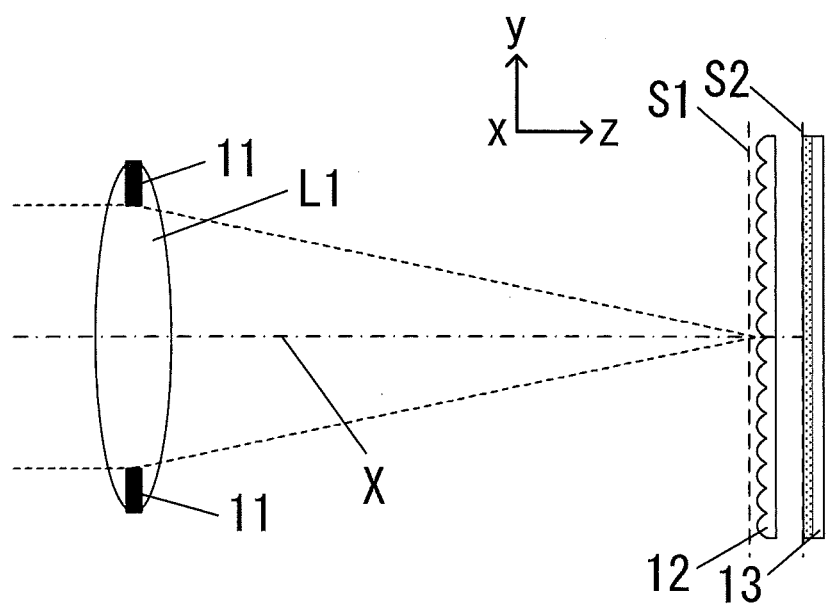
FIG. 3 A cross-sectional view schematically showing a photographic lens L1 and an image-capturing unit 100.

FIG. 3 is a cross-sectional view schematically showing the photographic lens L1 and the image-capturing unit 100. The microlens array 12 is provided in the vicinity of the predetermined imaging plane S1 of the photographic lens L1 shown in the left side in FIG. 3, and the image sensor 13 is provided in the vicinity of the focal position S2 of the microlens 120.

The subject image formed in the vicinity of the microlens array 12 by the photographic lens L1 is compressed by each microlens 120 included in the microlens array 12 and convoluted in the image sensor 13. For example, if an image magnification of the photographic lens L1 is 1/50, or if the photographic lens L1 forms a subject image that is 1/50 the size of the real subject on the predetermined imaging plane S1, the subject image is formed with the magnification of 1/2500, the square of 1/50, as seen in the depth direction. Thus, the photographic lens L1 forms a stereoscopic image, in which the subject in a three-dimensional space is compressed in the depth direction, on the predetermined imaging plane S1.

Figure 4:
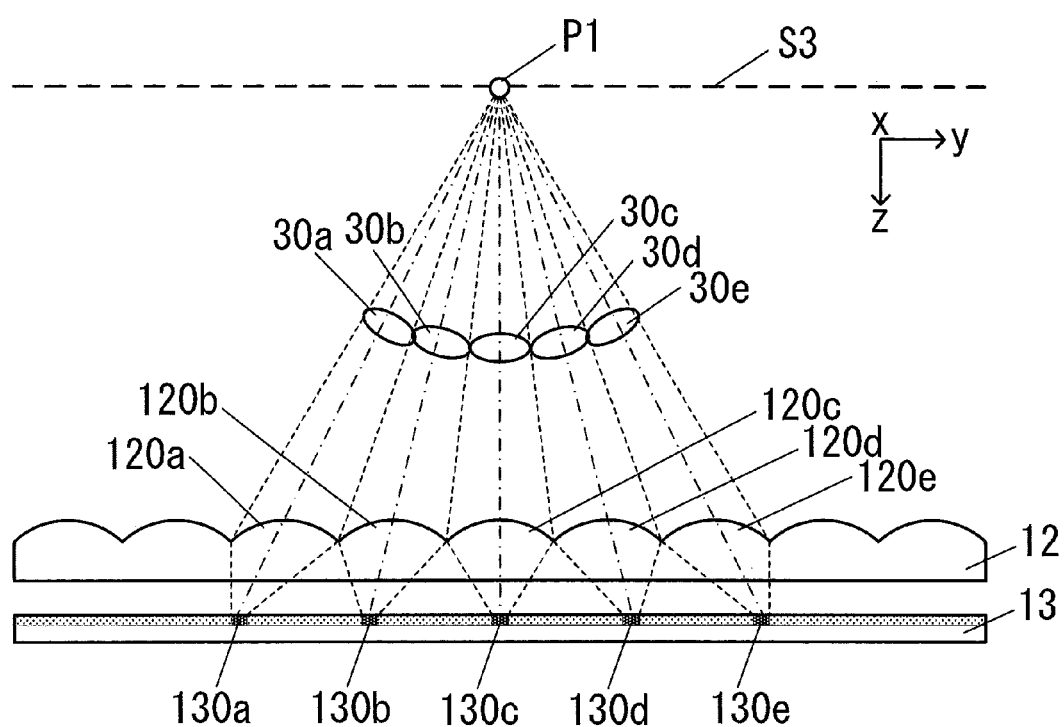
FIG. 4 A cross-sectional view schematically showing a light flux from a light point on an image plane to be synthesized there, and the image-capturing unit 100.

FIG. 4 is a cross-sectional view schematically showing a light flux from a light point on an image plane to be synthesized there, and the image-capturing unit 100. In FIG. 4, a light point P1 provided on an image plane S3 to be synthesized there will be considered. A divergence angle θ1 of a light directing from the light point P1 to the image-capturing unit 100 is restricted by a pupil size of the photographic lens L1 (i.e. a F-number of the photographic lens L1). If the F-number of the microlens 120 is equal to or smaller than the F-number of the photographic lens L1, the light flux emitting from the light point P1 and being incident on a microlens 120 does not diverge out of a region covered by the microlens 120.

Here, if the light flux from the light point P1 is incident on five microlenses 120a-120e as shown in FIG. 4, a total amount of radiation from the light point P1 restricted by the pupil can be obtained by integrating incident light amounts on the image-capturing planes of light fluxes 30a-30e incident on the microlenses 120a-120e (photodetection outputs of a group of image-capturing pixels 130a-130e).

In summary, in order to create a certain synthetic pixel constituting synthetic image data, a total light amount of a light cross-section on the image-capturing plane corresponding to coordinates of the synthetic pixel is to be calculated. For the purpose of performing this calculation, the image synthesizing part 105 first (1) determines microlenses 120 on which a light flux from a certain light point on an image plane to be synthesized there is incident, and then (2) determines image-capturing pixels on which the light flux from the light point is incident, for each determined microlens 120.

(1) In order to determine microlenses 120 on which a light flux from a certain light point on an image plane to be synthesized there is incident, it is only necessary to determine how the light flux from the light point diverges. As described above, the divergence angle of the light from the light point can be specified by the pupil of the photographic lens L1. It is assumed in the following description that the F-number of the photographic lens L1 is equal to the F-number of the microlens 120.

FIG. 5(a) is a cross-sectional view schematically showing divergence of lights from light points P4 and P5 on respective different image planes, and FIG. 5(b) is a plan view thereof, as seen from the side of the photographic lens L1. A light flux from the light point P4 located on an image plane S4 spaced apart from the microlens 120 with a distance of the focal length f of the microlens 120 is incident on the microlens array 12, while diverging to an extent 31 of exactly one microlens 120.

On the other hand, a light flux from the light point P5 located on an image plane S5 spaced apart from the microlens 120 with a distance of two times the focal length f of the microlens 120 (i.e. 2f) diverges to an extent 32 larger than one microlens 120, as shown in both FIG. 5(a) and FIG. 5(b).

In this way, microlenses 120 on which a light flux from a certain light point is incident can be determined based on the distance from the light point to the microlens 120 (i.e. the distance from the image plane to be synthesized there to the microlens 120). It should be noted that in practice it is necessary to determine these microlenses 120 also in consideration of the F-number of the photographic lens L1. For example, if the F-number of the photographic lens L1 is larger than the F-number of the microlens 120 (the photographic lens L1 is darker than the microlens 120), the divergence of the light flux from the light point is smaller.

The image synthesizing part 105 then (2) determines, for each determined microlens 120, image-capturing pixels on which the light flux from the light point is incident. If the light point is located at a distance of the focal length f from the microlens 120, such as the case of the light point P4 in FIG. 5, a circular light extends over the overall region covered by the microlens 120 directly under the light point P4. Accordingly, all image-capturing pixels 130 covered by one microlens 120 are to be selected in this case. If the light point is located at a distance less than the focal length f from the microlens 120, divergence of the light remains within the region covered by one microlens 120 because of restricted divergence angle of the incident light flux, even though the light does not converge, but diverges in the microlens 120.

On the other hand, if the light point is located at a distance larger than the focal length f, the light flux from the light point is incident on a plurality of microlenses 120. Therefore, it is required to select image-capturing pixels 130 needed for creation of a synthetic pixel, among a large number of image-capturing pixels 130 covered by the plurality of microlenses 120. In the following, a case where the light point is located at a distance larger than the focal length f will be described with reference to an example of the light point P5 in FIG. 5, i.e. a case where the light point is located at a distance of 2f from the microlens 120.

Figure 5:
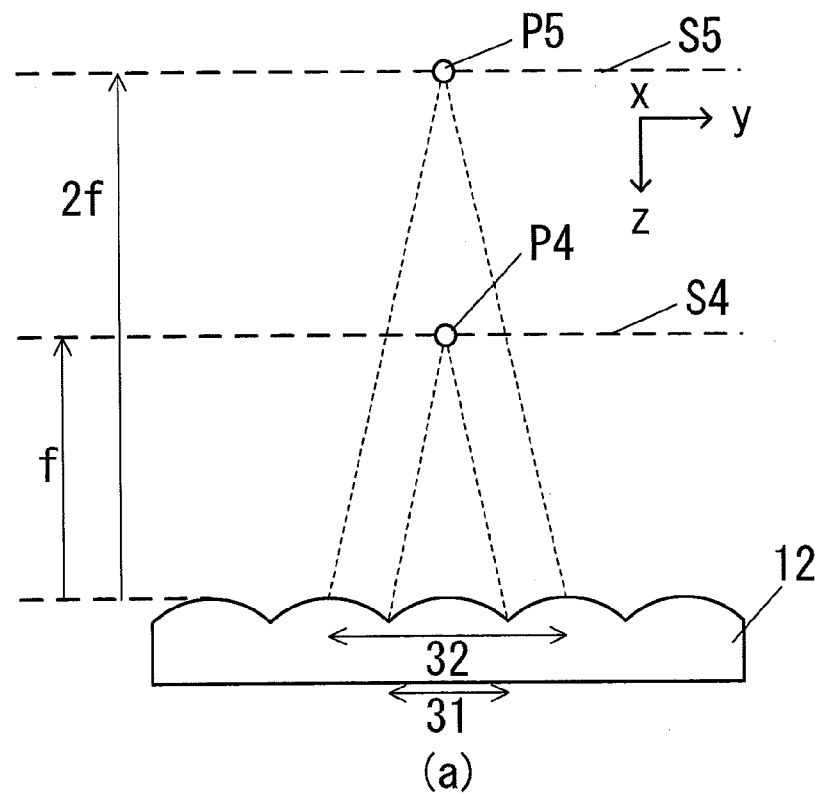
FIG. 5 A schematic view showing divergence of lights from light points P4 and P5 on respective different image planes.
Figure 5:
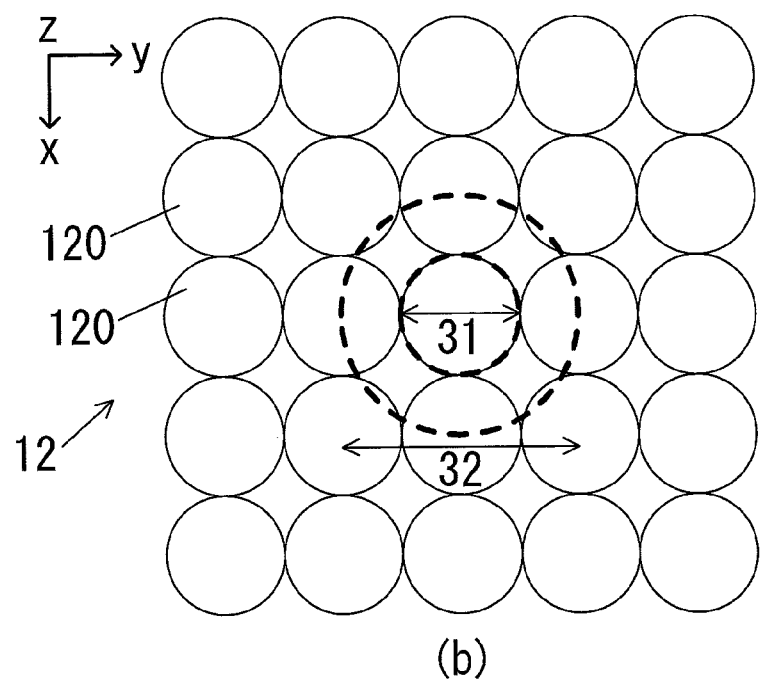

If the light point is located at a distance of 2f, the light flux from the light point is incident on a total of nine microlenses, i.e. a microlens 120 directly under the light point and eight adjacent microlenses 120, as shown in FIG. 5(*b*).

Figure 6:
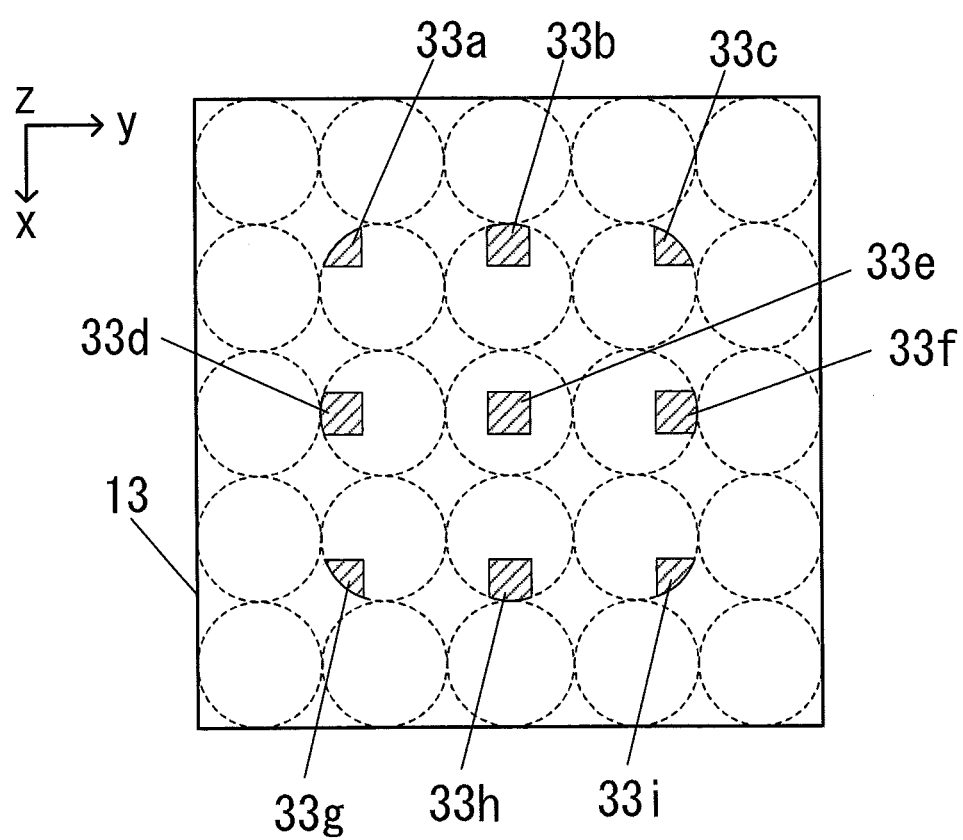
FIG. 6 A plan view of a part of the image-capturing plane of the image sensor 13 that is covered by 25 microlenses 120 shown in FIG. 5(b), as seen in the optical axis direction.

FIG. 6 is a plan view of a part of the image-capturing plane of the image sensor 13 that is covered by 25 microlenses 120 shown in FIG. 5(*b*), as seen in the optical axis direction. In FIG. 6, a position of each microlens 120 in FIG. 5(*b*) is shown by a dashed line, overlaying the image-capturing plane of the image sensor 13.

The light flux from the light point P5 shown in FIG. 5(*a*) is incident on nine regions 33*a*-33*i* shown in FIG. 6. As apparent from FIG. 6, the regions 33*a*-33*i* have shapes obtained by segmenting or dividing the region covered by one microlens 120 into nine segments. In this way, the size of the region on the image-capturing plane where a light flux from a light point is incident (the size of the light cross-section) is always same as the size of the region covered by one microlens 120, irrespective of the position of the light point.

Figure 7:
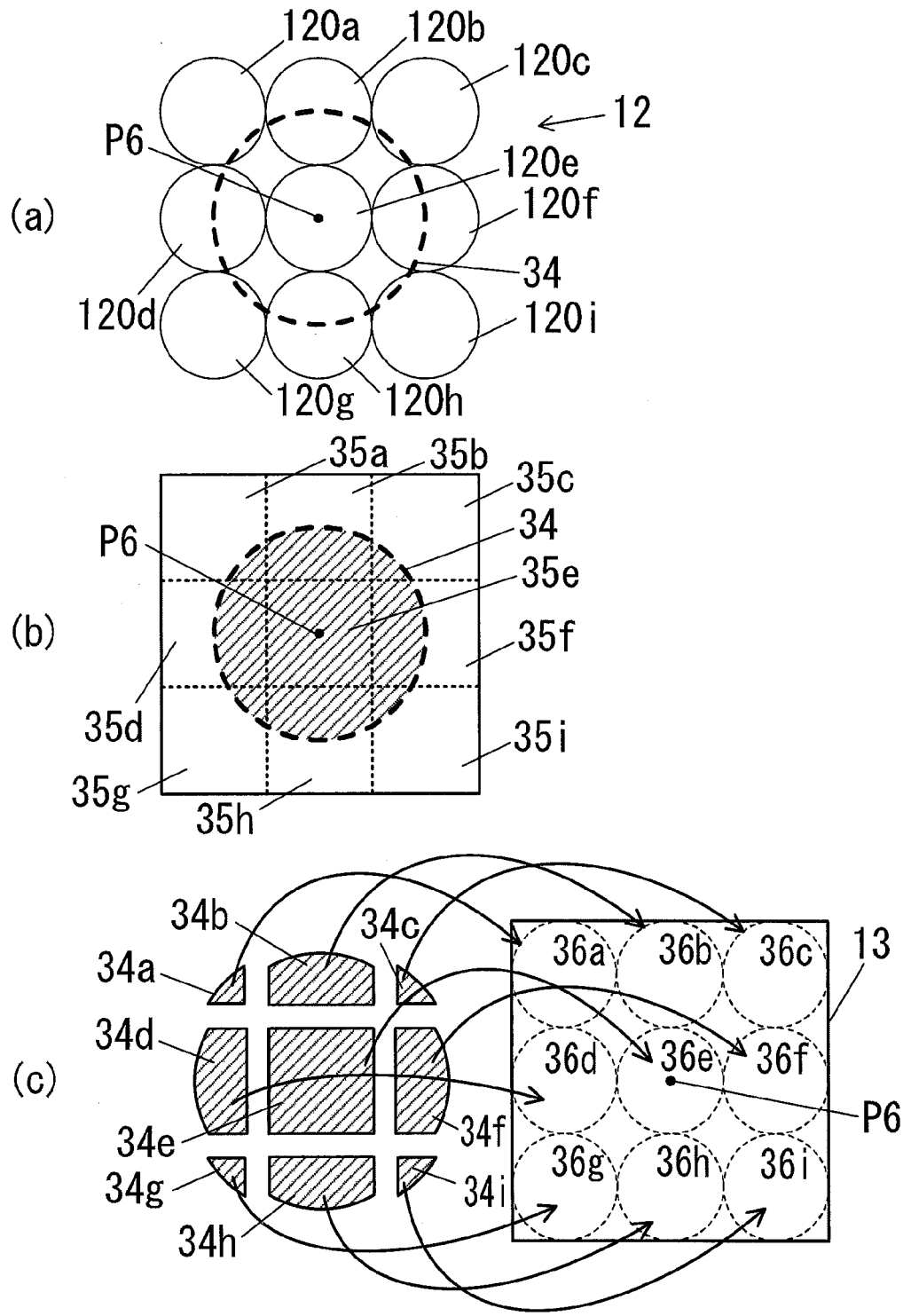
FIG. 7 A view for explaining a method for determining each incident region on an image-capturing plane in a case where a light flux from one light point is incident on a plurality of microlenses 120.

A method for determining each incident region on an image-capturing plane in a case where a light flux from one light point is incident on a plurality of microlenses 120 as in FIG. 6 will now be described with reference to FIG. 7. FIG. 7(*a*) is a plan view of a part of the microlens array 12, as seen in the optical axis direction. The control circuit 101 first determines a range over which the light flux from the light point P6 shown in the center of FIG. 7(*a*) extends. In this example, a region 34 spanning nine microlenses 120*a*-120*i* is the range over which the light flux from the light point P6 extends.

Then, as shown in FIG. 7(*b*), the region 34 is segmented by a grid having a pitch corresponding to each microlens 120. In FIG. 7(*b*), the region 34 over which the light flux from the light point P6 extends is segmented by square grid segments 35*a*-35*i* having a size equivalent to the diameter of each microlens 120, each grid segment being arranged to correspond to respective one of nine microlenses 120*a*-120*i* shown in FIG. 7(*a*).

Finally, each divided region 34*a*-34*i* is arranged in a region covered by its respective corresponding microlens 120*a*-120*i*, as shown in FIG. 7(*c*). Relative positions of the divided regions 34*a*-34*i* in the respective covered regions are identical to relative positions of nine square segments 35*a*-35*i* shown in FIG. 7(*b*). For example, the divided region 34*a* corresponding to the square segment 35*a* at the top left corner, among the square segments 35*a*-35*i* arranged in a 3×3 matrix, is arranged at the top left corner of the corresponding covered region 36*a*.

In this way, given that the height of the light point is h, the focal length of the microlens 120 is f, and the diameter of the microlens 120 is d, the image-capturing pixels on which the light flux from the light point is incident can be determined by segmenting the region over which the light flux from the light point extends by a grid having a width of d/(h/f). It should be noted that (h/f) can be a negative value. In such a case, the light point is considered to be located on the image sensor 13 side of the microlens 120.

Although the method for creating a synthetic pixel has been described with reference to an example in which a light point is located on a lens center axis of a certain microlens 120, this method for creating the synthetic pixel is also applicable to a case where the light point is located at a position other than that. If only the light points on the lens center axis of the certain microlens 120 were synthesized, the number of pixels of synthetic image data to be created would be limited to the number of the microlenses 120. As a result, only synthetic image data having a small number of pixels could be created. Hence, the image synthesizing part 105 in this embodiment sets a larger number of light points on the image plane to be synthesized there and creates synthetic pixels for these light points with the above-described synthesizing method, in order to create synthetic image data having a larger number of pixels.

Figure 8:
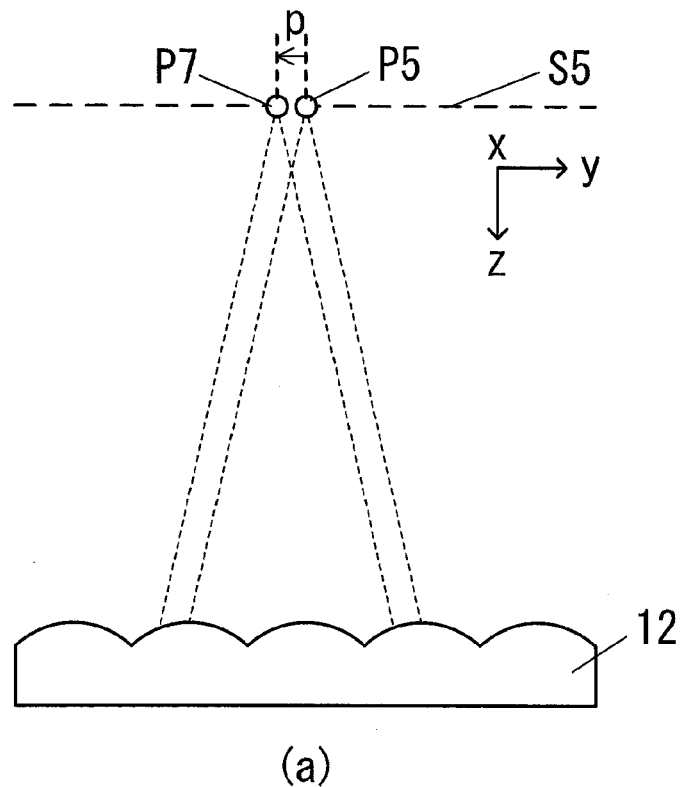
FIG. 8 A view showing a light point P7 shifted to the left by a distance p from the position of the light point P5, in the image plane S5 shown in FIG. 5.
Figure 8:
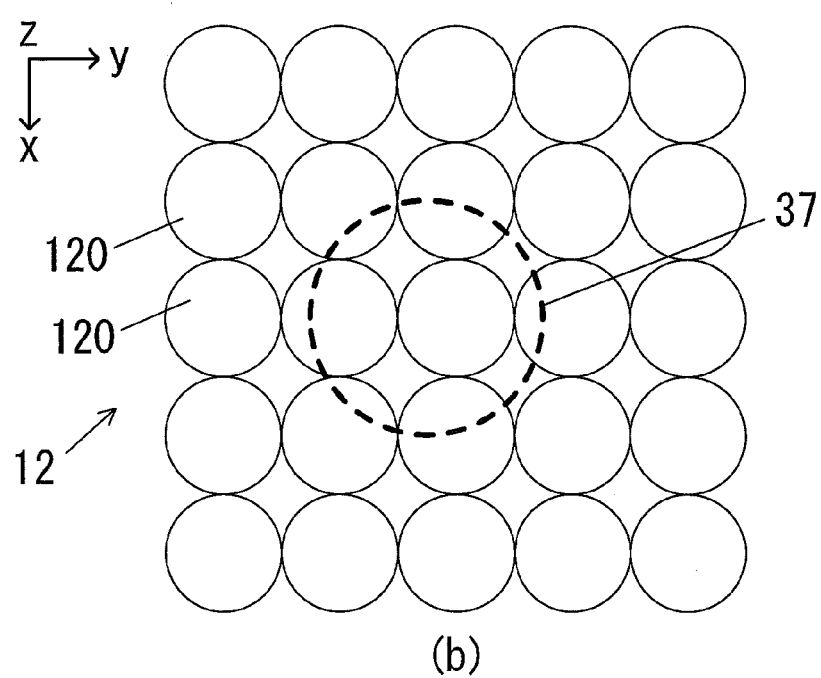

FIG. 8 is a view showing a light point P7 shifted to the left by a distance p from the position of the light point P5, in the image plane S5 shown in FIG. 5. In this case, a range 37 over which the light flux extends is also shifted to the left by the distance p. A synthetic pixel corresponding to the light point P7 can be therefore created by setting divided regions for the shifted range 37, in the same manner as in FIG. 7. For example, for one microlens 120, each light point is set at a position shifted by d/4 from its adjacent light point in both vertical and horizontal directions and a synthetic pixel is created for each light point. Consequently, sixteen synthetic pixels can be created from one microlens 120. In this case, the synthetic image data has the number of pixels that is sixteen times the number of the microlenses 120.

If a plurality of light points are provided on one microlens 120 to perform an image synthesis as described above, an output of one image-capturing pixel 130 is used for creation of a plurality of synthetic pixels. In practice, a large number of light points are consecutively located in a three-dimensional manner on an image plane to be synthesized there and lights from these light points are overlapped on the image-capturing plane of the image sensor 13. Therefore, for a given light point provided on the microlens 12, a photodetection output of the image-capturing pixel 130 on which a light flux from the light point is incident includes outputs corresponding to light fluxes from light points other than said light point.

Figure 9:
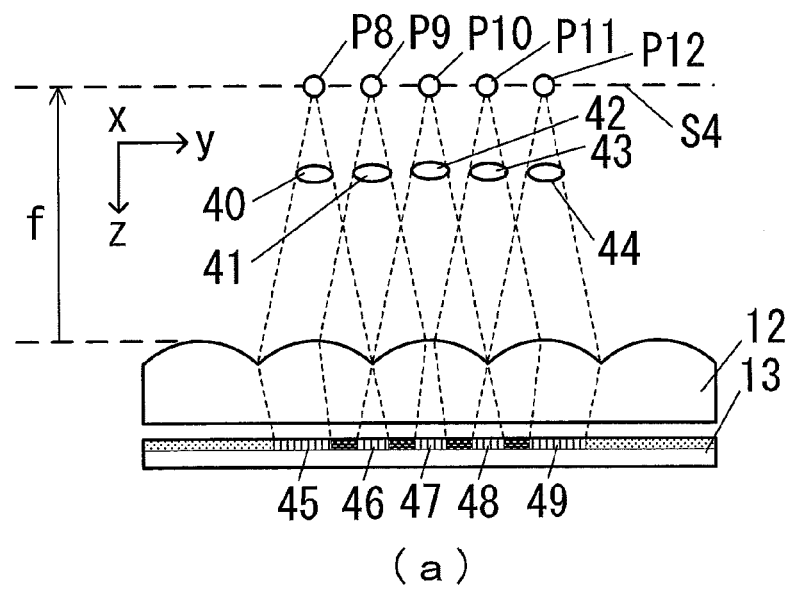
FIG. 9 A schematic view showing how light fluxes from light points overlap each other.
Figure 9:
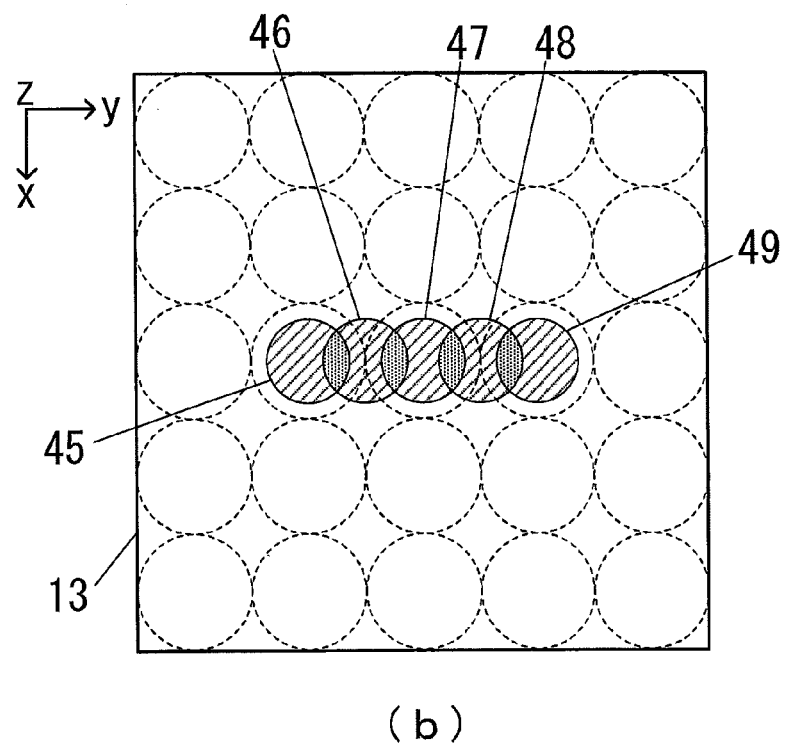

FIG. 9 is a schematic view showing how light fluxes from light points overlap each other. FIG. 9(a) is a cross-sectional view of the image plane S4 to be synthesized there, the microlens array 12, and the image sensor 13, taken along the Y-Z plane, and FIG. 9(b) is a plan view of the image-capturing plane of the image sensor 13, as seen in the optical axis direction. Five light points P8-P12 arranged in a line on the image plane S4 spaced apart from the microlens 120 with a distance of the focal length f of the microlens 120 will be considered below.

The five light points P8-P12 are provided at intervals of one-half of a width d of the microlens 120 (i.e. d/2). Specifically, the light points P8, P10, P12 are set on the center axes of their respective different microlenses 120, while the light points P9, P11 are set between two adjacent microlenses 120. In this case, light fluxes 40-44 from the light points P8-P12 are incident on regions 45-49 of the image-capturing plane of the image sensor 13, while overlapping each other.

For example, the light flux 41 from the light point P9 is incident on the region 46 shown in FIG. 9(b) and this region 46 overlaps the region 45 on which the light flux 40 from the light point P8 is incident and the region 47 on which the light flux 42 from the light point P10 is incident. In other words, a photodetection output from an image-capturing pixel 130 corresponding to an overlap region between the region 45 and the region 46 is a result of overlapping an output corresponding to the light flux 40 from the light point P8 and an output corresponding to the light flux 41 from the light point P9.

Here, given that a true strength of an i-th light point is ai, an output Pi of a synthetic pixel corresponding to the i-th light point can be calculated with the following equation (1).

[Math. 1]

$$P_i = \frac{a_{i-1} + a_{i+1}}{2} + a_i \quad (1)$$

The control circuit 101 segments or divides one microlens 120 into four in both vertical and horizontal directions to provide sixteen light points. In this case, the output Pi of the synthetic pixel can be likewise calculated with the following equation (2) for four light points arranged alongside each other.

[Math. 2]

$$P_i = \frac{a_{i-3} + a_{i+3}}{4} + \frac{2 \cdot (a_{i-2} + a_{i+2})}{4} + \frac{3 \cdot (a_{i-1} + a_{i+1})}{4} + a_i \quad (2)$$

Figure 10:
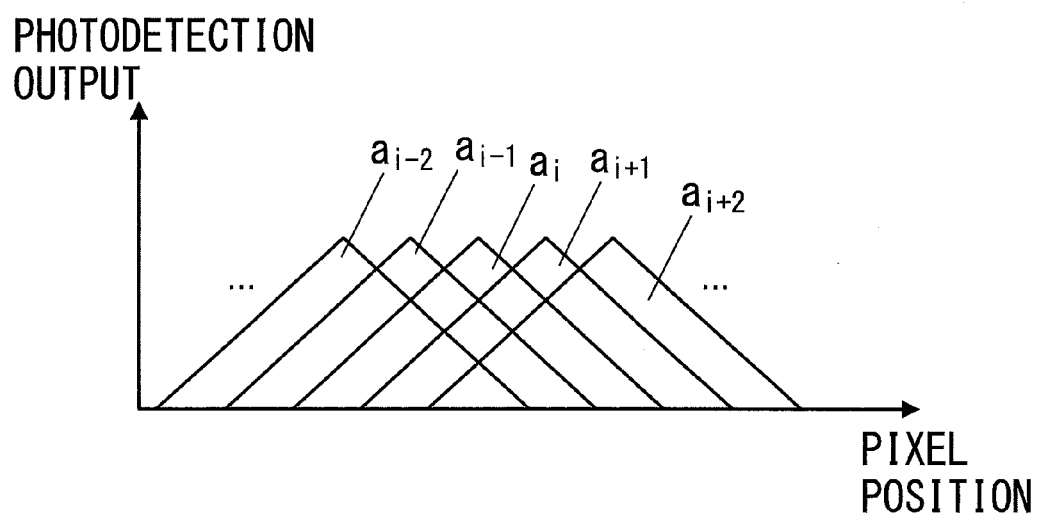
FIG. 10 A view showing an example of an output distribution of synthetic pixels.

An output distribution of the synthetic pixel in this case is shown in FIG. 10. An ordinate in FIG. 10 is pixel output and the abscissa is pixel position. As apparent from FIG. 10, the synthetic pixel is a pixel output obtained from a convolution integral of a triangle. A point spread function (PSF), which represents how the light flux from the light point diverges under the effect of the microlens 120, can be determined from such a output distribution.

The PSF is determined from an arrangement of a plurality of microlenses 120 and an arrangement of pixels to be synthesized in the image synthesizing part 105. In this embodiment, it is assumed that the size of the PSF is equal to the size of the region covered by one microlens 120.

Additionally, it is assumed that the number of elements of the PSF is equal to the number of a plurality of image-capturing pixels 130 covered by one microlens 120.

Although the output distribution of the synthetic pixel is shown in one dimension in FIG. 10, it is necessary to calculate the distribution in two dimensions in order to determine the PSF. In other words, the PSF can be determined by performing the calculation in consideration of not only overlapping of light fluxes from right and left light points, but also overlapping of light fluxes from all surrounding light points.

Figure 11:
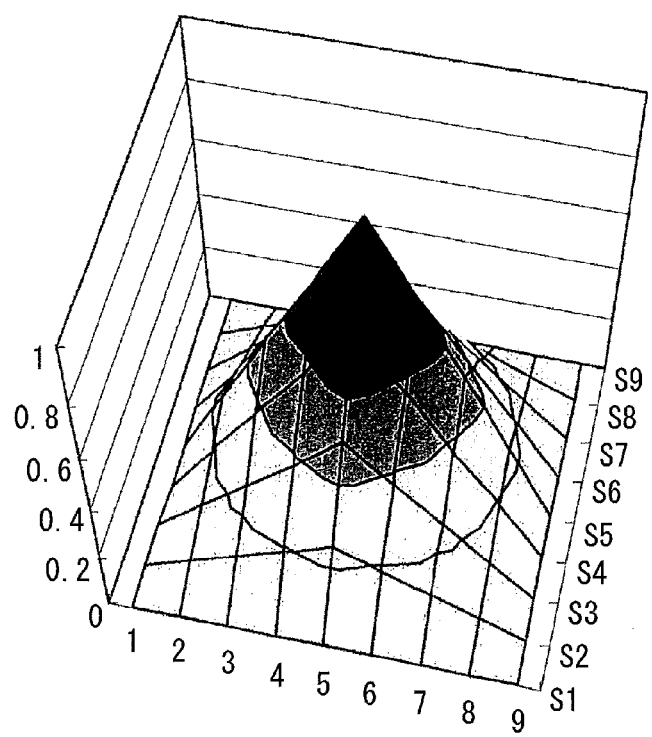
FIG. 11 A view showing an example of a PSF.

FIG. 11(a) is a view showing values of the derived PSF and FIG. 11(b) is a view in which the PSF is plotted in three-dimensional coordinates. In FIG. 11, the values of the PSF are shown for 81 points in one microlens 120.

The dividing part 107 uses the PSF derived as described above in order to decompose the overlapping of the image outputs shown in FIG. 10. The overlapping of the image outputs can be represented by the following equation (3). For the sake of simplicity, the equation (3) is here expressed in one dimension.

[Math. 3]

$$i(x) = \int_{-\infty}^{+\infty} psf(t) \cdot f(x-t) dt \quad (3)$$

In the above equation (3), psf(t) represents PSF, f(x) represents true light strength, and i(x) represents overlapped image output. Because psf(t) is known from the above-described method and the overlapped image output i(x) is also known, the true light strength f(x) can be determined. Then, a Fourier transform is performed on i(x) to represent the above equation (3) as a product of a Fourier transformed image PSF(u) of the PSF and a Fourier transformed image F(u) of the true light strength f(x). A Fourier transformed image I(u) of i(x) is thus represented by the following equation (4).

[Math. 4]

$$I(u) = PSF(u) * F(u) \quad (4)$$

From the above equation (4), the Fourier transformed image F(u) of the true light strength f(x) can be represented by the following equation (5).

[Math. 5]

$$F(u) = I(u)/PSF(u) \quad (5)$$

Because the functions i(x) and psf(x) and their Fourier transformed images I(u) and PSF(u) are already known, the Fourier transformed image F(u) of the true light strength f(x) can be derived from the above equation (5). Thereafter, an inverse Fourier transform is performed on the Fourier transformed image F(u) to determine the true light strength f(x).

However, in practice, when the above-described calculation is performed to determine the true light strength f(x), a high-frequency noise caused by arithmetic errors appears in the overall synthetic image data, which results in an unclear image. For this reason, the dividing part 107 in this embodiment uses a well-known Wiener filter to suppress the high-frequency noise. By applying the Wiener filter to the above equation (5), it becomes the following equation (6). The dividing part 107 determines the Fourier transformed image F(u) of the true light strength f(x) with the following equation (6), instead of the above equation (5), to create a clear synthetic image data in which the high-frequency noise is suppressed. In the following equation (6), PSF*(u) represents a complex conjugate of PSF(u).

[Math. 6]

$$F(u) = \frac{PSF^*(u)}{|PSF(u)|^2 + \delta} \cdot I(u) \quad (6)$$

The above-described sequence will be briefly described with reference to a block view shown in FIG. 1. An image-capturing signal output from the image sensor 13 is converted to a digital image signal by the A/D conversion circuit 102 and stored in the memory 103. A focal position to be synthesized there and an aperture value determining a depth of field are input from the operating unit 112 to the control circuit 101. The image synthesizing part 105 synthesizes a two-dimensional image with the input focal position and aperture value.

On the other hand, the Fourier transforming part 106 determines a point spread function (PSF) for one light point from the arrangement of the microlenses 120 in the microlens array 12 and the position of the synthetic pixels from the image synthesizing part 105, and performs a Fourier transform on the PSF and the synthetic image by the image synthesizing part 105. The dividing part 107 effectively divides the Fourier image of the synthetic image by the image synthesizing part 105 by the Fourier image of the PSF with the Wiener filter, as in the above equation (6), to obtain the Fourier image F(u) of the true light strength f(x). Finally, the inverse Fourier transforming part 108 performs an inverse Fourier transform on the Fourier image F(u) to obtain target image data which is improved over the original synthetic image data. This image is an image having a high contrast, with overlapping of the incident light flux by the microlens 120 being decomposed.

The following operations and advantageous effects can be achieved with the digital camera according to the above-described first embodiment.

(1) A digital camera 1 includes a microlens array 12 having a plurality of microlenses 120 arranged in a two-dimensional manner so that a light flux passing through the photographic lens L1 is incident thereon, and an image sensor 13 having a plurality of image-capturing pixels 130 arranged behind the plurality of the microlenses 120 to correspond to each of the plurality of microlenses 120, respectively. A control circuit 101 includes an image synthesizing part 105 for synthesizing image data of an image at an optional or any image plane of the photographic lens L1, based on outputs of the plurality of image-capturing pixels 130 corresponding to respective one of the plurality of microlenses 120, a Fourier transforming part 106 for performing a Fourier transform on the image data synthesized in the image synthesizing part 105, a dividing part 107 for effectively dividing the result of the Fourier transform by a Fourier image of a point spread function representing an optical divergence of a light flux incident on the plurality of microlenses 120, and an inverse Fourier transforming part 108 for performing an inverse Fourier transform on the result of the division in the dividing part 107 to create target image data. In this way, image data having both a high contrast and a high resolution can be synthesized.

(2) The dividing part 107 effectively divides the result of the Fourier transform in the Fourier transforming part 106, by applying a Wiener filter based on the Fourier image of the point spread function to the result of the Fourier transform in the Fourier transforming part 106. In this way, a clear image in which the high-frequency noise is suppressed can be obtained.

(Second Embodiment)

A digital camera according to a second embodiment of the present invention will now be described with reference to the drawings. The same parts as in the first embodiment are denoted by the same reference characters as in the first embodiment and the description thereof will be omitted herein.

Figure 12:
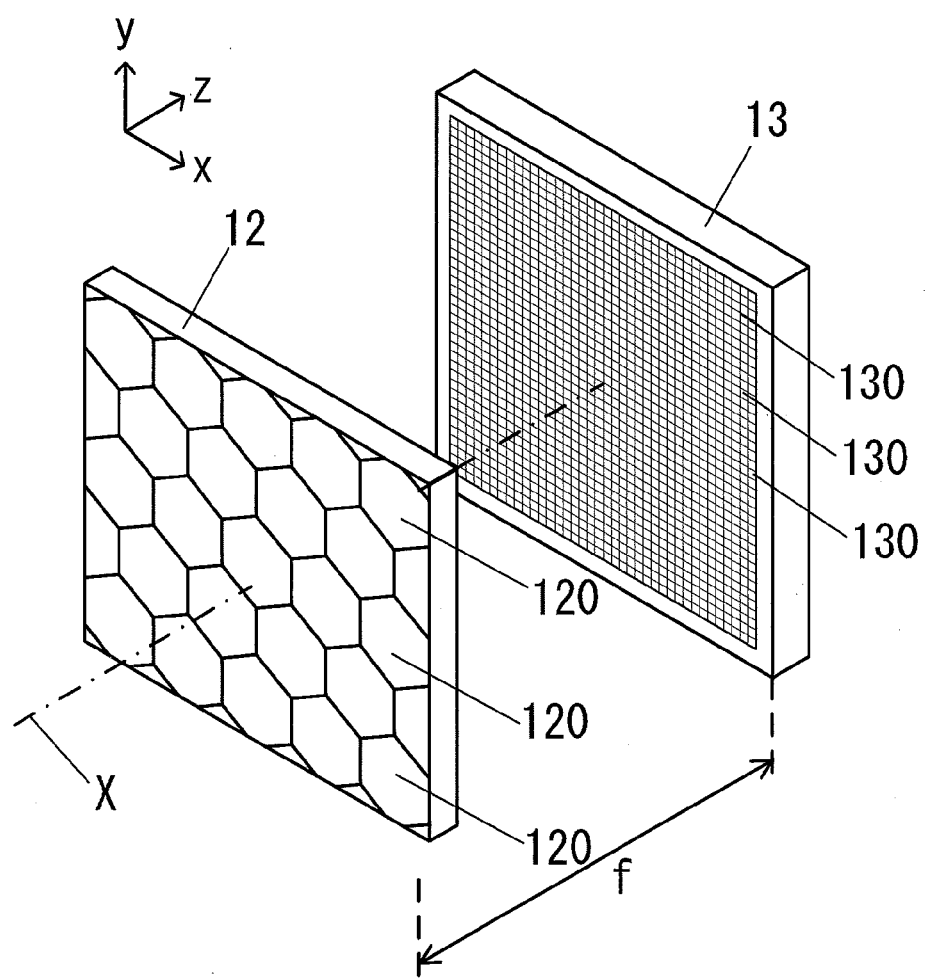
FIG. 12 A plan view of a microlens array 12 according to the second embodiment, as seen in the optical axis direction.

FIG. 12 is a plan view of a microlens array 12 according to the second embodiment, as seen in the optical axis direction. As shown in FIG. 12, hexagonal microlenses 120 forming a honeycomb structure are employed in this embodiment. The present invention is also applicable to the microlenses 120 having such a shape, in a similar manner to the first embodiment.

A PSF used in this embodiment is different from that in the first embodiment, because an arrangement of the microlenses 120 is different from that in the first embodiment. A method for deriving the PSF is per se the same as that in the first embodiment. That is, overlapping of light fluxes from surrounding light points such as in FIG. 10 is to be calculated in two dimensions.

The following variations are also within the scope of the present invention and one or more variations may be combined with the above-described embodiments.

(First Variation)

Although the embodiments in which the present invention is applied to a digital cameras capable of having an interchangeable lens have been described above, the present invention is not limited to the embodiments. The present invention is equally applicable to a camera having a built-in lens, for example.

(Second Variation)

The arrangement and shape of the microlenses 120 are not limited to that described in the first and second embodiments. This is also the case for the arrangement and shape of each image-capturing pixel in the image-capturing plane of the image sensor 13. For example, image-capturing pixels 130 covered by one microlens 120 may be separate from that covered by another microlens 120.

(Third Variation)

The true light strength f(x) may be determined without a Wiener filter. Thus, the dividing part 107 may be configured to determine F(u) with the above equation (4), instead of the above equation (5).

(Forth Variation)

In the above-described embodiments, overlapping of incident light fluxes caused by the microlens 120 is decomposed by applying processings of the Fourier transforming part 106, the dividing part 107, and the inverse Fourier transforming part 108 to the synthetic image synthesized in the image synthesizing part 105, in order to obtain an image having a high contrast. However, a high pass filter may be applied to such a part of an image before synthesis that has a high spatial frequency component, in order to previously compensate a contrast to be decreased.

It will now be described whether the high pass filter is effective to the original image before synthesis, instead of the synthetic image.

For the sake of simplicity of the description, it is assumed that an image is in the vicinity of a focal position of a microlens and f(x) is a variation of strength as a function of one-dimensional position of the image. The strength in the image sensor is f(x)/S, where S is a diameter of the microlens, because a light output diverges to an extent of S from this position. A position $x_0$ of a given image sensor plane is a position where those lights are overlapped and therefore the following equation can be obtained.

$$I(x_0) = \int_{-s/2}^{s/2} \frac{f(x+x_0)}{S} dx \qquad \text{[Math. 7]}$$

The difference from an adjacent pixel corresponds to a derivative of $I(x_0)$ and therefore can be considered as:

$$\frac{d}{dx}I(x_0) = \frac{1}{S}\int_{-s/2}^{s/2} \frac{df(x+x_0)}{dx} dx \qquad \text{[Math. 8]}$$

The right side of this equation is exactly f(x). Therefore, the high pass filter which increases the difference value translates to an increase in a gain of the original image f(x). Thus, a decrease in contrast of the display image is compensated by applying the high pass filter to the original image of the image sensor.

Figure 13:
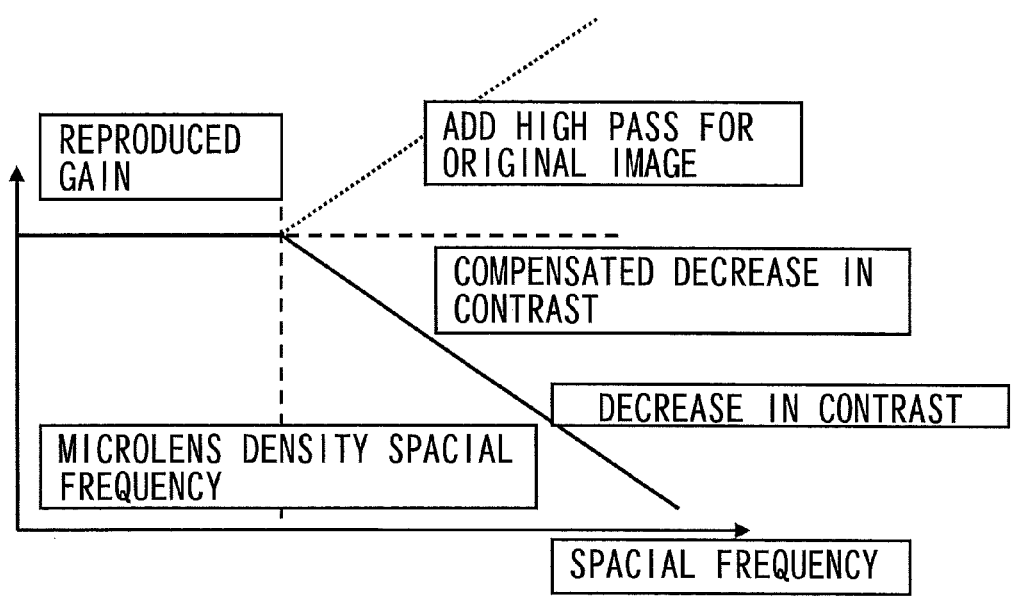
FIG. 13 A conceptual view for explaining how a contrast to be decreased is compensated by applying a high pass filter.

FIG. 13 is a conceptual view for explaining how a contrast to be decreased is compensated by applying the high pass filter. If a spatial frequency is lower than a density of microlenses, no problem arises with respect to the contrast of the synthetic image. However, if the spatial frequency is higher than the density of the microlenses, the contrast of the synthetic image is decreased due to the effect of the overlapping. For this reason, a part having a high spatial frequency is previously emphasized by performing high pass filter processing to the original image before synthesis. In this way, a decrease in contrast of the part having a high spatial frequency is compensated, when the image synthesis of an optional image plane is performed as described herein.

Figure 14:
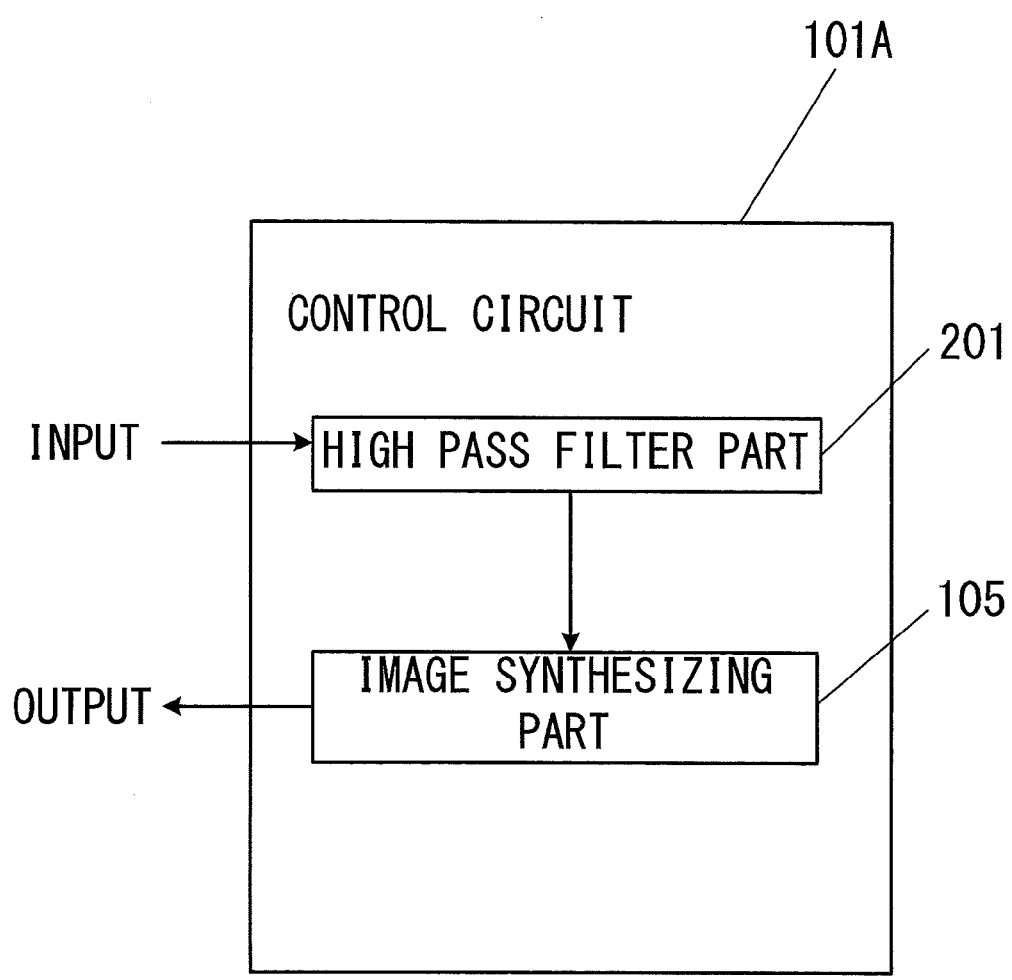
FIG. 14 A view showing a configuration of a control circuit 101A for implementing the forth variation.

FIG. 14 is a view showing a configuration of a control circuit 101A for implementing this variation. The control circuit 101A having a high pass filter part 201 and an image synthesizing part 105. The Fourier transforming part 106, the dividing part 107, and the inverse Fourier transforming part 108 of the control circuit 101 in FIG. 1 are omitted and the high pass filter part 201 is provided instead. The image synthesizing part 105 is identical to the image synthesizing part 105 in the above-described embodiments and therefore denoted by the same reference character.

Once original image data before image synthesis is input from the memory 103 to the control circuit 101A, the data is first input to the high pass filter part 201 and subjected to high pass filter processing. Thereafter, the data is input to the image synthesizing part 105 to synthesize a two-dimensional image of a focal position and an aperture value instructed by the operating unit 112, in the same manner as in the above-described embodiment. Thereafter, the synthetic image after synthesis is output.

In this way, a synthetic image in which a decrease in contrast is compensated can be created, even with a simple configuration in which high pass filter processing is applied to an original image before synthesis.

Unless impairing characteristics of the present invention, the present invention is not limited to the above-described embodiments, and, on the contrary, other embodiments conceivable within the scope of the technical idea of the present invention are also encompassed within the scope of the present invention.

The disclosure of the following priority application is herein incorporated by reference: Japanese Patent Application No. 2012-156940 filed Jul. 12, 2012.

REFERENCE SIGNS LIST

1 . . . digital camera, 2 . . . interchangeable lens, 12 . . . microlens array, 13 . . . image sensor, 101 . . . control circuit, 105 . . . image synthesizing part, 106 . . . Fourier transforming part, 107 . . . dividing part, 108 . . . inverse Fourier transforming part, 120 . . . microlens, 130 . . . image-capturing pixel, L1 . . . photographic lens

The invention claimed is:

1. An image processing device, comprising:
an image generation unit that is configured to generate an image at an optionally selected focal plane of a subject from output data of a plurality of photodetectors disposed at each of a plurality of microlenses;
a correction unit that is configured to correct output data of one of the plurality of photodetectors on which light from a first area of the subject and light from a second area of the subject are incident, based upon a point spread function that expresses an optical spread of a light flux incident to the microlenses; and
a control unit that is configured to control the image generation unit so as to generate pixels of the image each corresponding to the first area and the second area.

2. The image processing device according to claim 1, wherein:
a number of the pixels which is generated by the image generation unit is greater than a number of the microlenses.

3. The image processing device according to claim 2, wherein:
the correction unit comprises;
a Fourier transforming unit that is configured to perform a Fourier transformation upon the image generated by the image generation unit;
a calculation unit that is configured to effectively divide results of the Fourier transformation performed by the Fourier transforming unit, by a Fourier image of the point spread function; and
an inverse Fourier transforming unit that is configured to perform an inverse Fourier transformation upon results of the division by the calculation unit.

4. The image processing device according to claim 1, wherein:
the correction unit comprises;
a Fourier transforming unit that is configured to perform a Fourier transformation upon the image generated by the image generation unit;
a calculation unit that is configured to effectively divide results of the Fourier transformation performed by the Fourier transforming unit, by a Fourier image of the point spread function; and
an inverse Fourier transforming unit that is configured to perform an inverse Fourier transformation upon results of the division by the calculation unit.

5. An image-capturing device comprising:
the image processing device according to claim 1.

* * * * *